United States Patent
Kong et al.

(10) Patent No.: US 8,842,658 B2
(45) Date of Patent: Sep. 23, 2014

(54) SYNCHRONIZATION CHANNEL INTERFERENCE CANCELLATION

(75) Inventors: Hongwei Kong, Denville, NJ (US); Wei Luo, Marlboro, NJ (US); Li Fung Chang, Holmdel, NJ (US)

(73) Assignee: Broadcom Corporation, Irvine, CA (US)

( * ) Notice: Subject to any disclaimer, the term of this patent is extended or adjusted under 35 U.S.C. 154(b) by 155 days.

(21) Appl. No.: 13/428,022

(22) Filed: Mar. 23, 2012

(65) Prior Publication Data

US 2013/0142190 A1 Jun. 6, 2013

Related U.S. Application Data

(60) Provisional application No. 61/568,868, filed on Dec. 9, 2011, provisional application No. 61/565,864, filed on Dec. 1, 2011.

(51) Int. Cl.
*H04J 3/06* (2006.01)
*H04W 56/00* (2009.01)

(52) U.S. Cl.
CPC .................................. *H04W 56/002* (2013.01)
USPC ............................ 370/350; 370/342; 455/63.1

(58) Field of Classification Search
USPC ......... 370/241–252, 338, 350, 342; 455/63.1, 455/114.2
See application file for complete search history.

(56) References Cited

U.S. PATENT DOCUMENTS

| | | | | |
|---|---|---|---|---|
| 2002/0131390 | A1* | 9/2002 | Kuo et al. | 370/342 |
| 2010/0202313 | A1* | 8/2010 | Barratt et al. | 370/252 |
| 2011/0075711 | A1* | 3/2011 | Hasegawa | 375/147 |
| 2012/0281574 | A1* | 11/2012 | Pham et al. | 370/252 |

* cited by examiner

*Primary Examiner* — Kan Yuen
(74) *Attorney, Agent, or Firm* — McDermott Will & Emery LLP

(57) ABSTRACT

Disclosed are various embodiments for cancellation of a PSCH signal and/or SSCH signal from an RX input signal. A PSCH sequence and SSCH sequence are extracted a PSCH and SSCH signal. A relative gain associated with the PSCH signal and SSCH signal are determined relative to a CPICH signal. A reconstructed PSCH and SSCH signal are generated and cancelled from the RX input signal.

20 Claims, 7 Drawing Sheets

SYNCHRONIZATION CHANNEL INTERFERENCE CANCELLATION

CROSS-REFERENCE TO RELATED APPLICATIONS

This application claims priority to co-pending U.S. provisional application Ser. No. 61/565,864, entitled "Cellular Baseband Processing," filed Dec. 1, 2011, which is incorporated herein by reference in its entirety. This application also claims priority to co-pending U.S. Provisional application Ser. No. 61/568,868, entitled "Cellular Baseband Processing," filed Dec. 9, 2011, which is incorporated herein by reference in its entirety.

BACKGROUND

Cellular wireless communication systems support wireless communication services in many populated areas of the world. Cellular wireless communication systems include a "network infrastructure" that wirelessly communicates with wireless terminals within a respective service coverage area. The network infrastructure typically includes a plurality of base stations dispersed throughout the service coverage area, each of which supports wireless communications within a respective cell (or set of sectors). The base stations couple to base station controllers (BSCs), with each BSC serving a plurality of base stations. Each BSC couples to a mobile switching center (MSC). Each BSC also typically directly or indirectly couples to the Internet.

In operation, each base station communicates with a plurality of wireless terminals operating in its serviced cell/sectors. A BSC coupled to the base station routes voice communications between the MSC and the serving base station. The MSC routes the voice communication to another MSC or to the PSTN. BSCs route data communications between a servicing base station and a packet data network that may include or couple to the Internet. Transmissions from base stations to wireless terminals are referred to as "forward link" transmissions while transmissions from wireless terminals to base stations are referred to as "reverse link" transmissions. The volume of data transmitted on the forward link typically exceeds the volume of data transmitted on the reverse link. Such is the case because data users typically issue commands to request data from data sources, e.g., web servers, and the web servers provide the data to the wireless terminals.

Wireless links between base stations and their serviced wireless terminals typically operate according to one (or more) of a plurality of operating standards. These operating standards define the manner in which the wireless link may be allocated, setup, serviced, and torn down. Popular currently employed cellular standards include the Global System for Mobile telecommunications (GSM) standards, the North American Code Division Multiple Access (CDMA) standards, and the North American Time Division Multiple Access (TDMA) standards, among others. These operating standards support both voice communications and data communications. Other operating standards include the Universal Mobile Telecommunications Services (UMTS)/Wideband CDMA (WCDMA) standards. The UMTS/WCDMA standards employ CDMA principles and support high throughput, both voice and data.

In many CDMA based implementations, a hierarchical synchronization channels (SCH) have been adopted by 3GPP WCDMA. Hierarchical SCH is composed of a primary synchronization channel (P-SCH) and secondary a synchronization channel (S-SCH). The P-SCH and S-SCH may be transmitted at the same time. The P-SCH is used for slot boundary detection. The S-SCH may carry scrambling code group information, e.g. primary scrambling code in a 3GPP WCDMA. Both the P-SCH and the S-SCH may be used for channel estimation and frequency synchronization. These channels, however, can cause interference with a data channel associated with communications between a base station and/or mobile devices, such as the HS-PDSCH. This is due to the fact that P-SCH and S-SCH do not maintain code orthogonality with the code channels transmitted from a base station.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Embodiments of the present disclosure are directed to systems and methods for cancelling a primary synchronization channel (PSCH) signal as well as a secondary synchronization channel (SSCH) signal from a received input in a WCDMA system. A PSCH and/or SSCH can cause interference with an RX data channel particularly in high geometry conditions. Accordingly, embodiments of the disclosure can reconstruct as well as cancel the effects of the PSCH and/or SSCH from the RX data channel to improve RX and/or TX performance of a wireless terminal communicating with a base station in a WCDMA environment.

Figure 1:
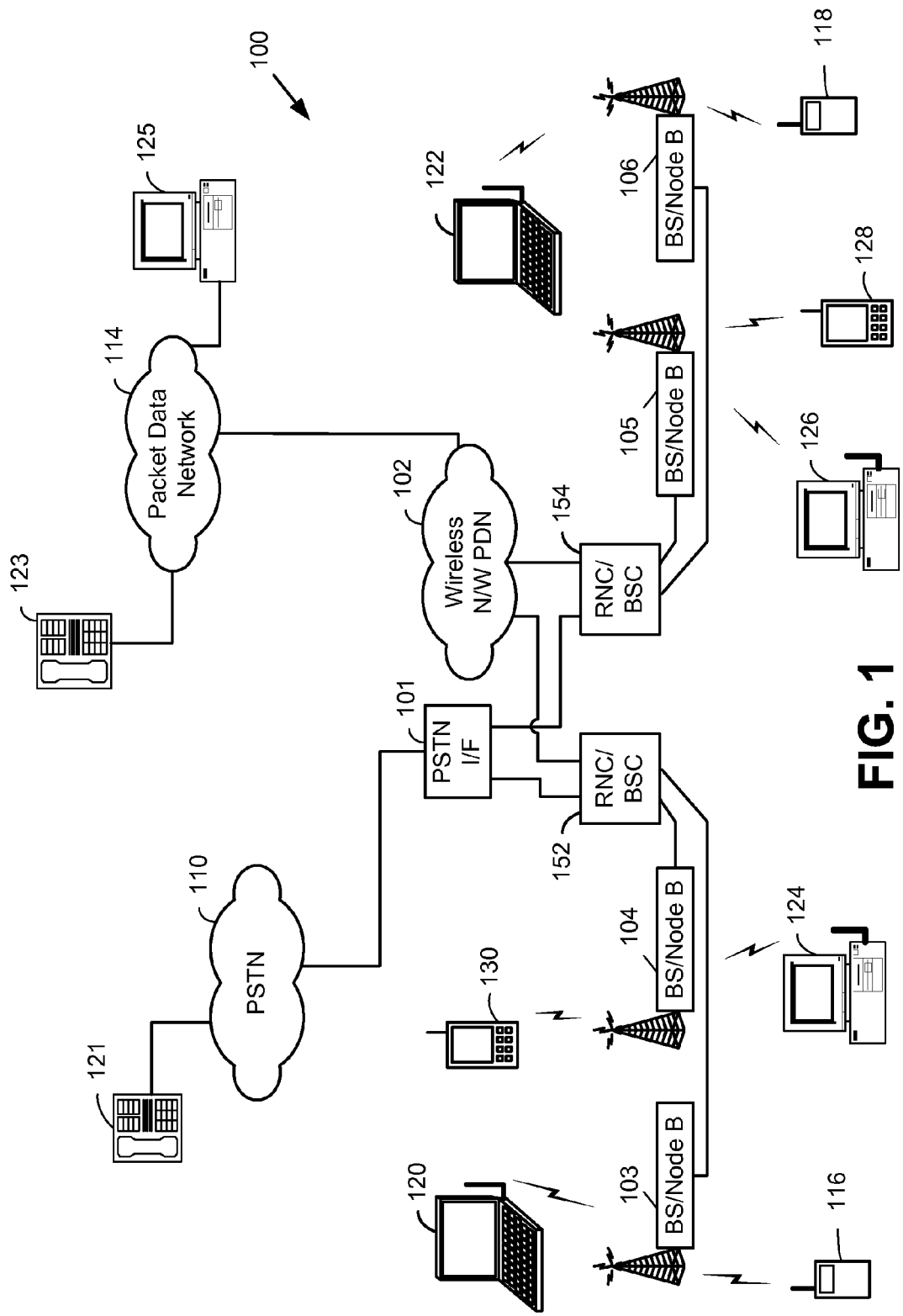
FIG. 1 is a system diagram illustrating a portion of a cellular wireless communication system that supports wireless terminals operating according to various embodiments of the present disclosure.

FIG. 1 is a system diagram illustrating a portion of a cellular wireless communication environment 100 that supports wireless terminals operating according to the present invention. The cellular wireless communication system 100 includes a Public Switched Telephone Network (PSTN) Interface 101, e.g., Mobile Switching Center, a wireless network packet data network 102 that includes GPRS Support Nodes, EDGE Support Nodes, WCDMA Support Nodes, and other components, Radio Network Controllers/Base Station Controllers (RNC/BSCs) 152 and 154, and base stations/node Bs 103, 104, 105, and 106. The wireless network packet data network 102 couples to additional private and public packet data networks 114, e.g., the Internet, WANs, LANs, etc. A conventional voice terminal 121 couples to the PSTN 110. A Voice over Internet Protocol (VoIP) terminal 123 and a personal computer 125 couple to the Internet/WAN 114. The PSTN Interface 101 couples to the PSTN 110. Of course, this particular structure may vary from system to system.

Each of the base stations/node Bs 103-106 services a cell/set of sectors within which it supports wireless communications. Wireless links that include both forward link components and reverse link components support wireless communications between the base stations and their serviced wireless terminals. These wireless links support digital data communications, VoIP communications, and other digital multimedia communications. The cellular wireless communication system 100 may also be backward compatible in supporting analog operations as well. The cellular wireless communication system 100 supports one or more of the UMTS/WCDMA standards, the Global System for Mobile telecommunications (GSM) standards, the GSM General Packet Radio Service (GPRS) extension to GSM, the Enhanced Data rates for GSM (or Global) Evolution (EDGE) standards, and/or various other CDMA standards, TDMA standards and/or FDMA standards, etc.

Wireless terminals 116, 118, 120, 122, 124, 126, 128, and 130 couple to the cellular wireless communication system 100 via wireless links with the base stations 103-106. As illustrated, wireless terminals may include cellular telephones 116 and 118, laptop computers 120 and 122, desktop computers 124 and 126, and data terminals 128 and 130. However, the cellular wireless communication system 100 supports communications with other types of wireless terminals as well. As is generally known, devices such as laptop computers 120 and 122, desktop computers 124 and 126, data terminals 128 and 130, and cellular telephones 116 and 118, are enabled to "surf" the Internet 114, transmit and receive data communications such as email, transmit and receive files, and to perform other data operations. Many of these data operations have significant download data-rate requirements while the upload data-rate requirements are not as severe. Some or all of the wireless terminals 116-130 are therefore enabled to support the EDGE operating standard, the GPRS standard, the UMTS/WCDMA standards, and/or the GSM standards.

Figure 2:
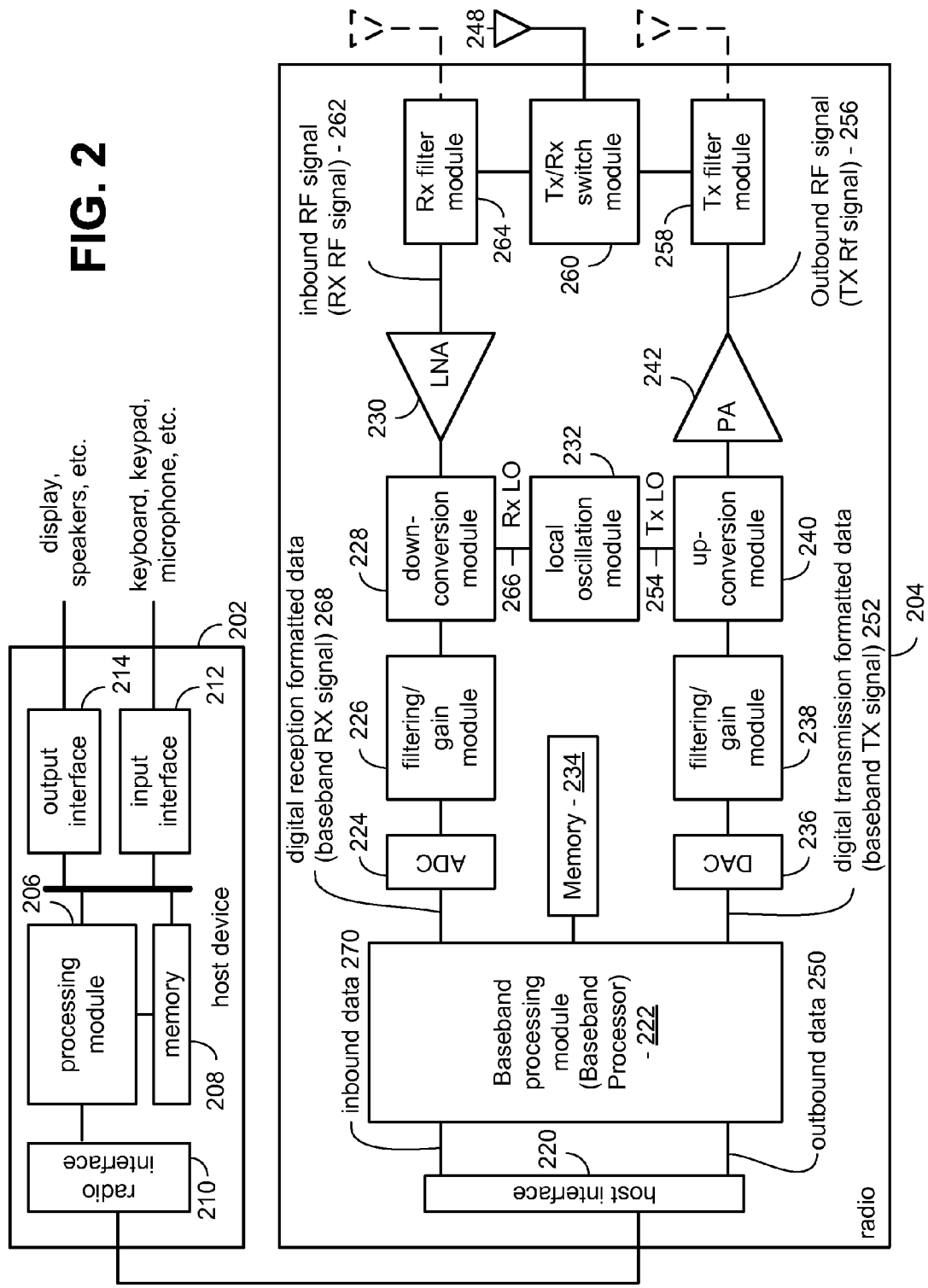
FIG. 2 is a block diagram functionally illustrating a wireless terminal constructed according to various embodiments of the present disclosure.

FIG. 2 is a schematic block diagram illustrating a wireless terminal that includes host processing components 202 and an associated radio 204. For cellular telephones, the host processing components and the radio 204 are contained within a single housing. In some cellular telephones, the host processing components 202 and some or all of the components of the radio 204 are formed on a single Integrated Circuit (IC). For personal digital assistants hosts, laptop hosts, and/or personal computer hosts, the radio 204 may reside within an expansion card and, therefore, reside be house separately from the host processing components 202. The host processing components 202 include at least a processing module 206, memory 208, radio interface 210, an input interface 212, and an output interface 214. The processing module 206 and memory 208 execute instructions to support host terminal functions. For example, for a cellular telephone host device, the processing module 206 performs user interface operations and executes host software programs among other operations.

The radio interface 210 allows data to be received from and sent to the radio 204. For data received from the radio 204 (e.g., inbound data), the radio interface 210 provides the data to the processing module 206 for further processing and/or routing to the output interface 214. The output interface 214 provides connectivity to an output display device such as a display, monitor, speakers, et cetera such that the received data may be displayed. The radio interface 210 also provides data from the processing module 206 to the radio 204. The processing module 206 may receive the outbound data from an input device such as a keyboard, keypad, microphone, et cetera via the input interface 212 or generate the data itself. For data received via the input interface 212, the processing module 206 may perform a corresponding host function on the data and/or route it to the radio 204 via the radio interface 210.

Radio 204 includes a host interface 220, baseband processing module 222 (baseband processor) 222, analog-to-digital converter 224, filtering/gain module 226, down conversion module 228, low noise amplifier 230, local oscillation module 232, memory 234, digital-to-analog converter 236, filtering/gain module 238, up-conversion module 240, power amplifier 242, RX filter module 264, TX filter module 258, TX/RX switch module 260, and antenna 248. Antenna 248 may be a single antenna that is shared by transmit and receive paths (half-duplex) or may include separate antennas for the transmit path and receive path (full-duplex). The antenna implementation will depend on the particular standard to which the wireless communication device is compliant.

The baseband processing module 222 in combination with operational instructions stored in memory 234, execute digital receiver functions and digital transmitter functions. The digital receiver functions include, but are not limited to, digital intermediate frequency to baseband conversion, demodulation, constellation demapping, descrambling, and/or decoding. The digital transmitter functions include, but are not limited to, encoding, scrambling, constellation mapping, modulation, and/or digital baseband to IF conversion. The transmit and receive functions provided by the baseband processing module 222 may be implemented using shared processing devices and/or individual processing devices. Processing devices may include microprocessors, microcontrollers, digital signal processors, microcomputers, central processing units, field programmable gate arrays, programmable logic devices, state machines, logic circuitry, analog circuitry, digital circuitry, and/or any device that manipulates signals (analog and/or digital) based on operational instructions. The memory 234 may be a single memory device or a plurality of memory devices. Such a memory device may be a read-only memory, random access memory, volatile memory, non-volatile memory, static memory, dynamic memory, flash memory, and/or any device that stores digital information. Note that when the baseband processing module 222 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 204 receives outbound data 250 from the host processing components via the host interface 220. The host interface 220 routes the outbound data 250 to the baseband processing module 222, which processes the outbound data 250 in accordance with a particular wireless communication standard (e.g., UMTS/WCDMA, GSM, GPRS, EDGE, etc) to produce digital transmission formatted data 252. The digital transmission formatted data 252 is a digital base-band signal or a digital low IF signal, where the low IF will be in the frequency range of zero to a few kilohertz/megahertz.

The digital-to-analog converter 236 converts the digital transmission formatted data 252 from the digital domain to the analog domain. The filtering/gain module 238 filters and/or adjusts the gain of the analog signal prior to providing it to the up-conversion module 240. The up-conversion module 240 directly converts the analog baseband or low IF signal into an RF signal based on a transmitter local oscillation 254 provided by local oscillation module 232. The power amplifier 242 amplifies the RF signal to produce outbound RF signal 256, which is filtered by the TX filter module 258. The TX/RX switch module 260 receives the amplified and filtered RF signal from the TX filter module 258 and provides the output RF signal 256 signal to the antenna 248, which transmits the outbound RF signal 256 to a targeted device such as a base station 103-106.

The radio 204 also receives an inbound RF signal 262, which was transmitted by a base station via the antenna 248, the TX/RX switch module 260, and the RX filter module 264. The low noise amplifier 230 receives inbound RF signal 262 and amplifies the inbound RF signal 262 to produce an amplified inbound RF signal. The low noise amplifier 230 provides the amplified inbound RF signal to the down conversion module 228, which converts the amplified inbound RF signal into an inbound low IF signal or baseband signal based on a receiver local oscillation 266 provided by local oscillation module 232. The down conversion module 228 provides the inbound low IF signal (or baseband signal) to the filtering/gain module 226, which filters and/or adjusts the gain of the signal before providing it to the analog to digital converter 224. The analog-to-digital converter 224 converts the filtered inbound low IF signal (or baseband signal) from the analog domain to the digital domain to produce digital reception formatted data 268. The baseband processing module 222 demodulates, demaps, descrambles, and/or decodes the digital reception formatted data 268 to recapture inbound data 270 in accordance with the particular wireless communication standard being implemented by radio 204. The host interface 220 provides the recaptured inbound data 270 to the host processing components 202 via the radio interface 210.

Figure 3:
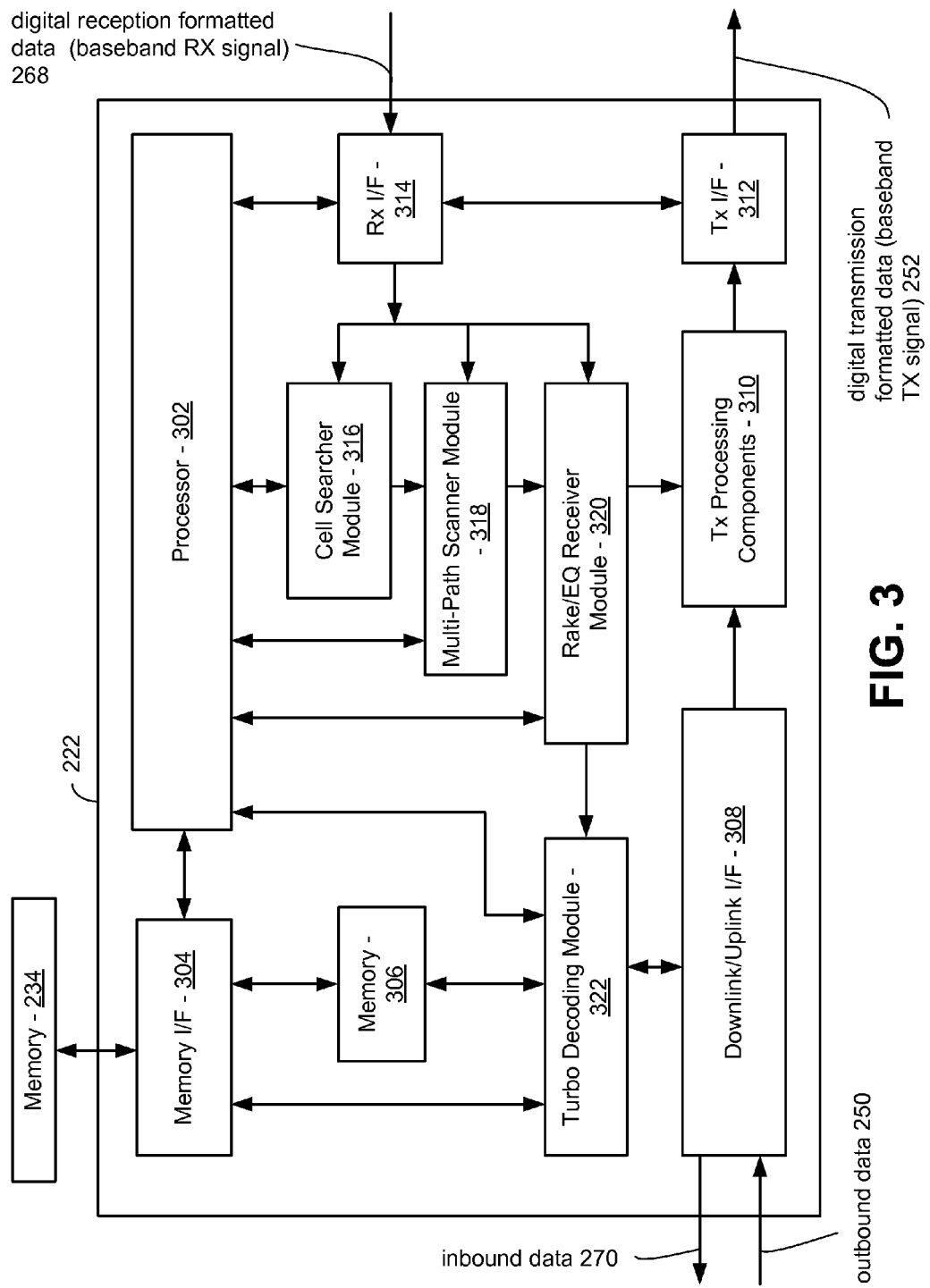
FIG. 3 is a block diagram illustrating components of a baseband processing module according to various embodiments of the present disclosure.

FIG. 3 is a block diagram illustrating components of a baseband processing module 222 according to an embodiment of the present invention. Components of baseband processing module 222 (baseband processor) 222 include a processor 302, a memory interface 304, onboard memory 306, a downlink/uplink interface 308, TX processing components 310, and a TX interface 312. The baseband processing module 222 further includes an RX interface 314, a cell searcher module 316, a multi-path scanner module 318, a rake receiver equalization module 320, and a turbo decoding module 322. The baseband processing module 222 couples in some embodiments to external memory 234. However, in other embodiments, memory 306 services the memory requirements if the baseband processing module 222.

As was previously described with reference to FIG. 2, the baseband processing module 222 receives outbound data 250 from coupled host processing components 202 and provides inbound data 270 to the coupled host processing components 202. The baseband processing module 222 provides digital formatted transmission data (baseband TX signal) 252 to a coupled RF front end. The baseband processing module 222 receives digital reception formatted data (baseband RX signal) 268 from the coupled RF front end. As was previously described with reference to FIG. 2, an ADC 224 produces the digital reception formatted data (baseband RX data) 268 while the DAC 236 of the RF front end receives the digital transmission formatted data (baseband TX signal) 252 from the baseband processing module 222.

The downlink/uplink interface 308 is operable to receive the outbound data 250 from coupled host processing components, e.g., the host processing component 202 via host interface 220. The downlink/uplink interface 308 is operable to provide inbound data 270 to the coupled host processing components 202 via the host interface 220. As the reader will appreciate, the baseband processing module 222 may be formed on a single integrated circuit with the other components of radio 204. Alternately, the radio 204 (including the baseband processing module 222) may be formed in a single integrated circuit along with the host processing components 202. Thus, in such case, all components of FIG. 2 excluding the antenna, display, speakers, et cetera and keyboard, keypad, microphone, et cetera may be formed on a single integrated circuit. However, in still other embodiments, the baseband processing module 222 and the host processing components 202 may be formed on a separate integrated circuit. Many differing constructs integrated circuit constructs are possible without departing from the teachings of the present invention. TX processing component 310 and TX interface 312 communicatively couple to the RF front end as illustrated in FIG. 2 and to the downlink/uplink interface 308. The TX processing components 310 and TX interface 312 are operable to receive the outbound data from the downlink/uplink interface 304, to process the outbound data to produce the baseband TX signal 252 and to output the baseband TX signal 252 to the RF front end as was described with reference to FIG. 2.

Figure 4A:
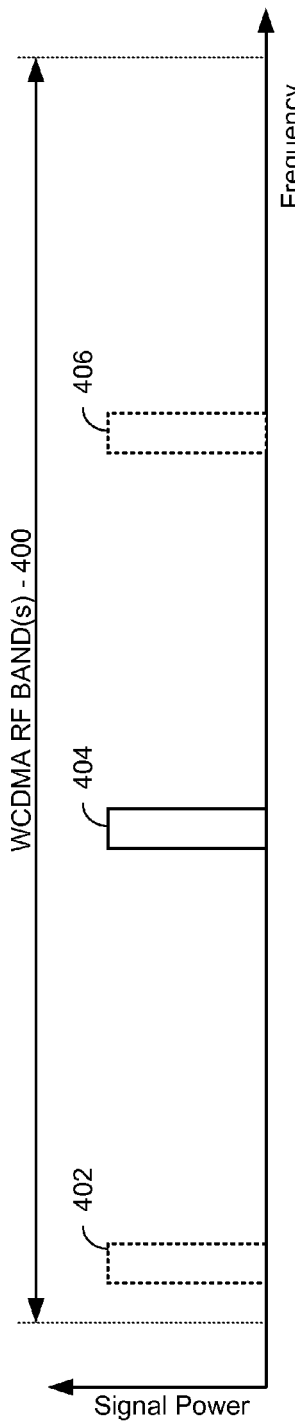
FIG. 4A is a graph illustrating diagrammatically the power spectral density of WCDMA RF band(s) supporting multiple RF carriers.

FIG. 4A is a graph illustrating diagrammatically the power spectral density of WCDMA RF band(s) 400 supporting multiple RF carriers 402, 404, and 406. The WCDMA RF band(s) 400 extend across a frequency spectrum and include WCDMA RF carriers 402, 404, and 406. The cell searcher module 316 of the baseband processing module 222 of an RF transceiver that supports WCDMA operations according to the present invention is operable to scan the WCDMA RF band(s) 400 to identify WCDMA RF energy of at least one WCDMA carrier 402, 404, or 406. During initial cell search operations, the cell searcher module 316 will, in combination with other components of the baseband processing module 222, identify a strongest WCDMA carrier, e.g., 404. Then, the cell searcher module 316 synchronizes to WCDMA signals within the WCDMA carrier 404. These WCDMA signals corresponding to a particular base station cell or sector. In these initial cell search synchronization operations, the cell searcher module 316 preferably synchronizes to a strongest cell/sector.

WCDMA signals transmitted from multiple base stations/sectors may use a common WCDMA RF carrier 404. Alternately, the WCDMA signals from differing base stations/sectors may use differing WCDMA carriers, e.g., 402 or 406. According to the present invention, the cell searcher module 316 and the baseband processing module 222 are operable to synchronize to WCDMA signals from differing cells/sectors operating in one or more of the WCDMA RF bands 402, 404, or 406. Such synchronization operations occur not only for initial cell search but for neighbor cell search or detected cell search operations. The reader should note that the WCDMA RF bands 402, 404, and 406 are not shown as being adjacent in FIG. 4A. Of course, in many systems, WCDMA RF bands may reside adjacent one another with a required channel separation.

Figure 4B:
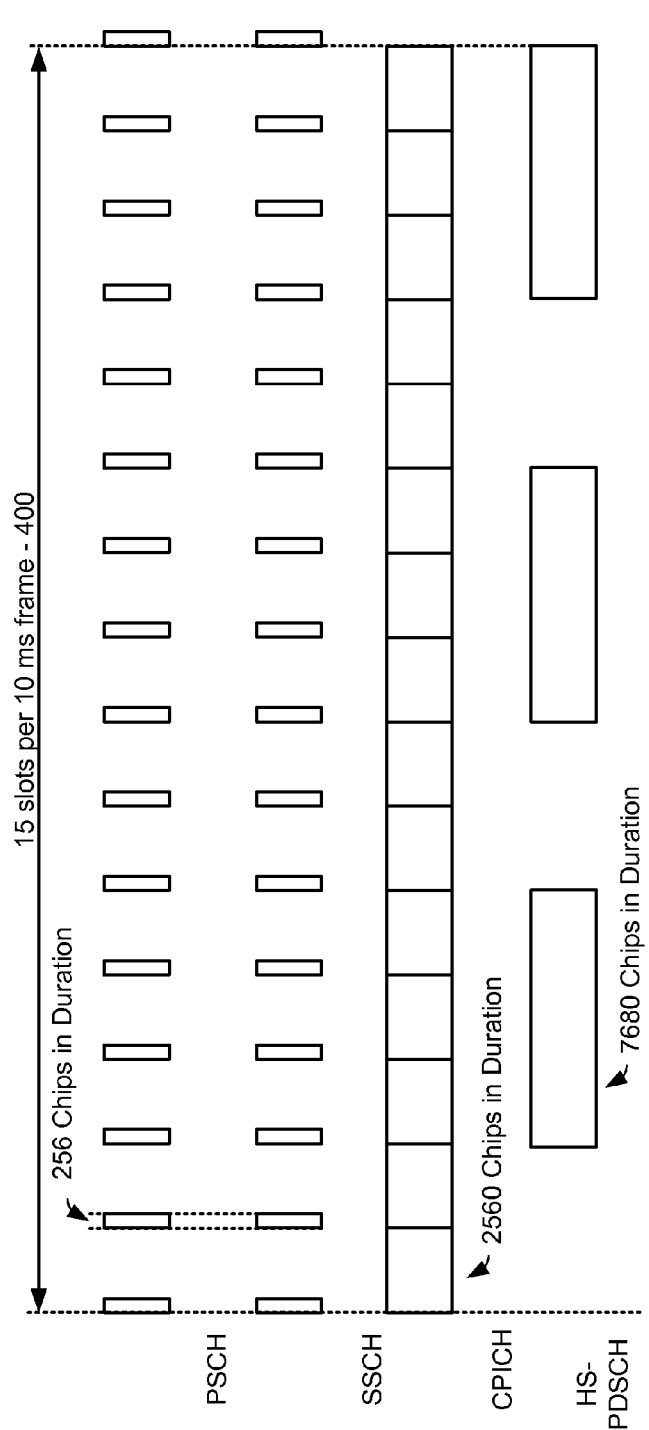
FIG. 4B is a block diagram diagrammatically illustrating the timing of various channels of a WCDMA system according to various embodiments of the present disclosure.

FIG. 4B is a block diagram diagrammatically illustrating the timing of various channels of a WCDMA system employed for cell searching and base station synchronization according to the present invention. The WCDMA signal illustrated has a 15 slot frame structure that extends across 10 ms in time. The WCDMA signal includes a Synchronization Channel (SCH) and a Common Pilot Channel (CPICH), which are introduced in the downlink to assist wireless transceivers in performing cell search operations. The SCH is further split into a primary SCH (PSCH) and a secondary SCH (SSCH). The PSCH carries a primary synchronization code (PSC) which is chosen to have good periodic auto correlation properties and the secondary SCH (SSCH) carries a secondary synchronization code (SSC). The PSCH and the SSCH are constructed such that their cyclic-shifts are unique so that reliable slot and frame synchronization can be achieved. The PSCH and the SSCH are 256-chips long with special formats and appear/1;10 of each time slot. The rest of time slot is Common Control Physical Channel (CCPCH). As shown in FIG. 4A, the PSCH and the SSCH are transmitted once in the same position in every slot. The PSCH code is the same for all time slots, and therefore is used to detect slot boundary. The SSCH is used to identify scrambling code group and frame boundary. Thus, the SSCH sequences vary from slot to slot and are coded by a code-book with 64 code-words (each representing a code-group). The CPICH carries pre-defined symbols with a fixed rate (30 kbps, hence 10 symbols per time slot) and spreading factor of 256. The channelization code for CPICH is fixed to the 0th code. Additionally, the PSCH and/or SSCH can also cause interference with the High Speed Physical Downlink Shared Channel (HS-PDSCH) as shown.

According to the present invention, the baseband processing module 222 can reconstruct the PSCH and SSCH and cancel the effects of the PSCH and SSCH from a data channel in a WCDMA system. The PSCH and SSCH are not orthogonal relative to signals that are encoded in the data channel because all wireless terminals in communication with a base station must be able to receive and decode the data embedded within the PSCH and SSCH. Accordingly, interference from the PSCH and SSCH is often apparent in a data or traffic channel that is received by the wireless terminal. An embodiment of the invention can substantially cancel the interference effects of the PSCH and SSCH from the data channel, which can improve performance particularly in high geometry conditions.

Figure 5:
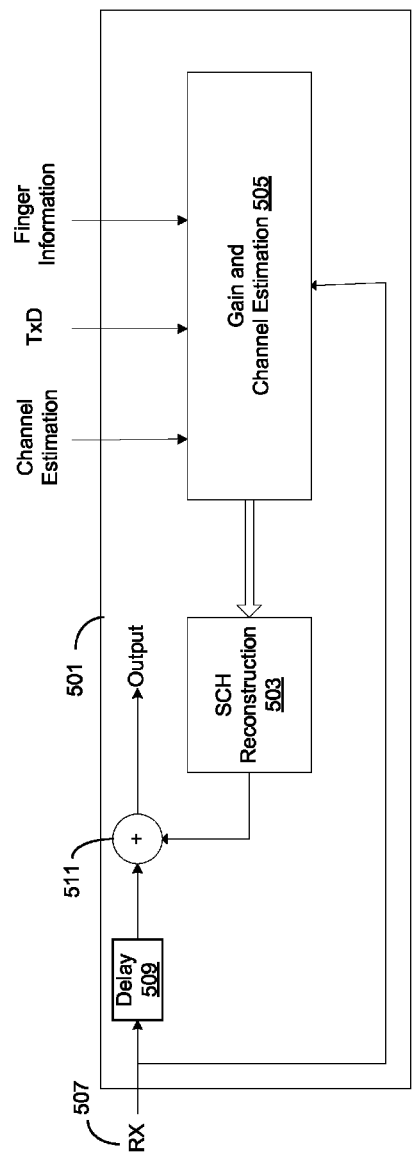
FIG. 5 is a block diagram of a synchronization channel interference cancellation module implemented in a baseband processing module according to various embodiments of the present disclosure.

In one embodiment, the processor 302 can be configured to perform cancellation of the PSCH and/or SSCH from the RX data channel. In other embodiments, a cancellation module can be placed at various points within the RX processing flow such as in the RX Interface 314 and/or the rake receiver equalization module 320. The depicted embodiment is but one example. Accordingly, reference is now made to FIG. 5, which illustrates one way in which the baseband processing module 222 can cancel a PSCH and/or SSCH signal from the RX data channel. In the depicted example, a synchronization channel interference cancellation module (SCM) 501 can be executed by the processor 302 and/or implemented as a dedicated circuit within the baseband processing module 222 and employed anywhere in the RX data channel processing flow to perform cancellation of a PSCH signal and/or SSCH signal. For example, the SCM module 501 can be placed and/or executed just after the cell searcher module 316 has acquired the PSCH and SSCH data and the RX data channel is further processed by the processor 302.

In the depicted example, the SCM module 501 can perform a sync channel reconstruction in a sync channel (SCH) reconstruction module 503. The SCH reconstruction module 503 can reconstruct the PSCH signal as well as SSCH signal that may be present in the RX data channel and then cancel the effects of the PSCH and SSCH signals from the RX data channel. The SCH reconstruction module 503 can reconstruct the PSCH and/or SSCH from a channel estimation of the common pilot channel (CPICH) as well as a gain of the PSCH relative to the CPICH and the gain of the SSCH relative to the CPICH, which can be generated by the gain and channel estimation module 505. The gain and channel estimation module can generate the relative gains of the PSCH and SSCH from a channel estimation of the CPICH, a transmit diversity indication that indicates a transmit diversity of the base station, as well as finger information from the rake receiver 320. The finger information from the rake receiver can include, but is not limited to, a total power of the CPICH as well as phase information associated with the CPICH. The transmit diversity indication allows reconstruction of the PSCH and SSCH by selection of the appropriate channel estimation corresponding to an antenna system or antenna corresponding to the received PSCH and/or SSCH.

Accordingly, upon generating a reconstructed PSCH and/or SSCH, the SCM module 501 can cancel the effects of the PSCH and/or SSCH from the RX input 507 by subtracting the reconstructed PSCH and SSCH from the RX input 507 at the adder module 511. In some embodiments, a delay module 509 can be employed to impart a delay on the RX input 507 in the event that reconstruction of the PSCH and SSCH by the SCH reconstruction module 503 causes a signal delay. The SCM Module 501 can be implemented in the processor 302 as well as in a special purpose hardware module that is located in various positions in the processing flow of an RX input signal as long as the output is injected back into the processing flow at the appropriate clock rate. It should be appreciated that the example shown and discussed herein is but one example.

Figure 6:
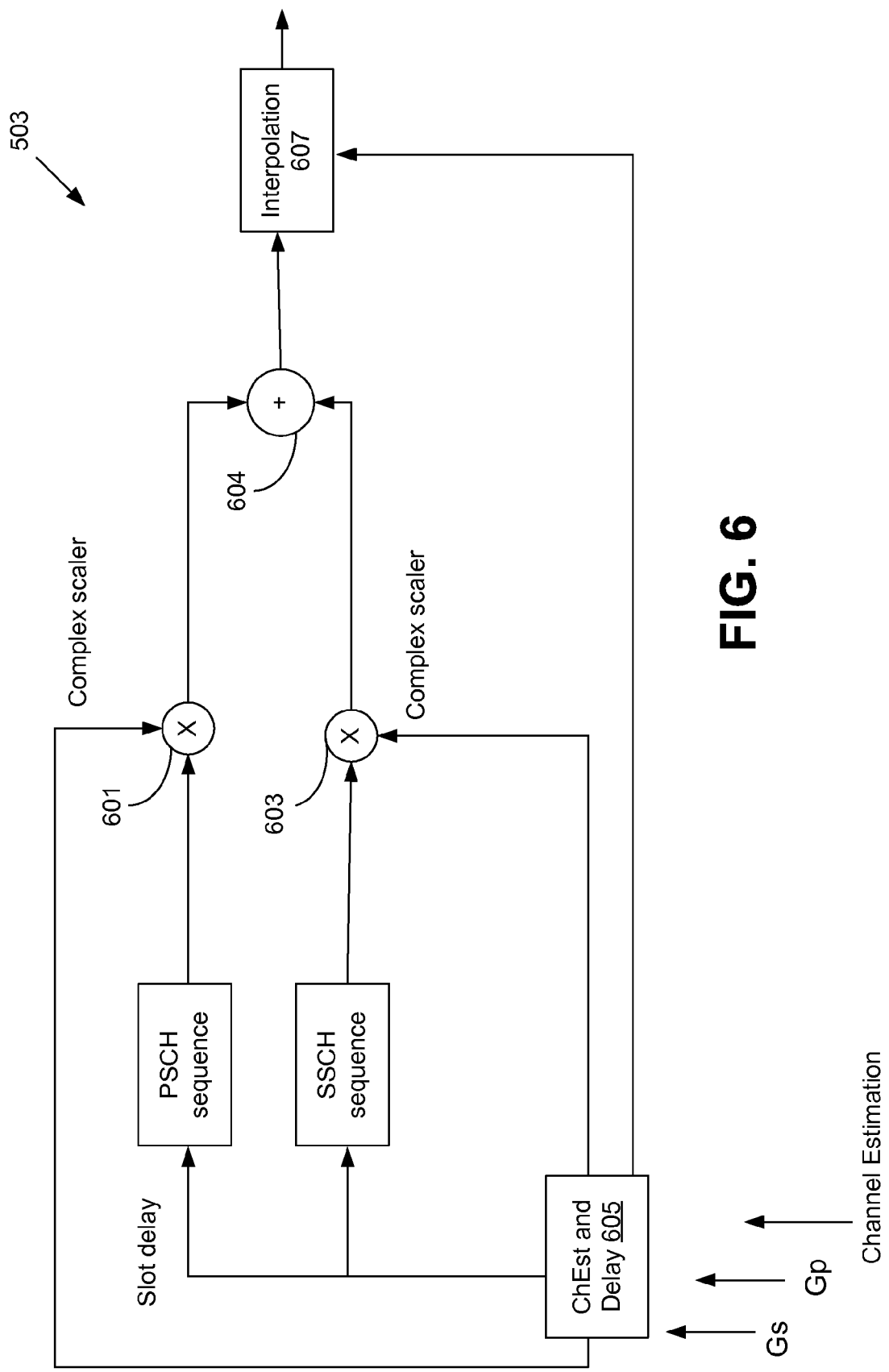
FIG. 6 is a block diagram of a synchronization channel reconstruction module implemented in a baseband processing module according to various embodiments of the present disclosure.

Reference is now made to FIG. 6, which illustrates one implementation of the SCH reconstruction module 503 according to various embodiments of the disclosure. In the depicted embodiment, the SCH reconstruction module 503 receives as inputs a gain of the PSCH signal and SSCH signal relative to the CPICH, which are represented by $G_p$ and $G_s$ in FIG. 6. Additionally, a channel estimation of the CPICH is also received as an input. The channel estimation and delay module 605 can multiply the relative gains corresponding to the PSCH and/or SSCH with the channel estimation. The channel estimation and delay module 605 can provide slot delay information to an interpolation module 607 as well as multipliers 601 and 603, which can multiply a scaling factor corresponding to signal attenuation within the RX transceiver with the PSCH and/or SSCH sequence as well as other information as shown in the formulations discussed below. The adder 604 can combine the PSCH and SSCH to form a combined reconstructed signal. The interpolation module 607 can interpolate the combined reconstructed signal with a clock rate at the point where the RX input where the combined reconstructed signal is cancelled is injected back into the baseband processing module.

The SCH reconstruction module 503 can perform reconstruction of the PSCH and SSCH according to the following formulation. First, the RX input can be characterized according to the following formulation:

$$r(m) = H(m)\beta_{P\text{-}SCH} \cdot s_{P\text{-}SCH} + H(m)\beta_{S\text{-}SCH} \cdot s_{S\text{-}SCH} + H(m) s_{CPICH} s_{SCR} + n$$

Where n includes the other orthogonal variable spreading factors (OVSF), interference, and/or noise associated with the CPICH, $\beta_{P\text{-}SCH}$ is the power ratio of the PSCH relative to the CPICH, $s_{P\text{-}SCH}$ is the PSCH sequence, $\beta_{S\text{-}SCH}$ is the power ratio of the SSCH relative to the CPICH, $s_{S\text{-}SCH}$ is the SSCH sequence, $s_{CPCH}$ is the CPICH sequence, $s_{SCR}$ is the scrambling code corresponding to the base station, and H(m) is the channel coefficient.

The channel estimation corresponding to the CPICH is generated according to the following formulation:

$$\hat{H}_{CPICH}(m) = H(m) \cdot CPICH\_CE\_SCALE + n_1$$

Where CPICH_CE_SCALE is the scaling factor in CPICH channel estimation and $n_2$ is noise. PSCH and SSCH matched filter output is generated according to the following formulation, where SCH_CORR_SCALE is the scaling factor in PSCH and SSCH symbol correlation, respectively and can be equal to $256 * \sqrt{2}$:

$$SCH\_CORR(m) = H(m)\beta \cdot SCH\_CORR\_SCALE + n_2$$

β estimation is generated using the following formulation:

$$\hat{\beta} = \frac{SCH\_CORR(m) \cdot CPICH\_CE\_SCALE}{SCH\_CORR\_SCALE \cdot \hat{H}_{CPICH}(m)}$$

γ can then be estimated according to the following formulation:

$$\hat{\gamma} = \frac{\hat{\beta}}{CPICH\_CE\_SCALE \cdot \sqrt{2}} = \frac{SCH\_CORR(m)}{SCH\_CORR\_SCALE \cdot \hat{H}_{CPICH}(m) \cdot \sqrt{2}}$$

The above formulation after IIR filtering to improve accuracy can be represented by the following formulation:

$$\hat{\gamma}_{iir}(m) = (1-\alpha)\hat{\gamma}_{iir}(m-1) + \alpha\hat{\gamma}(m)$$

Accordingly, $\gamma_{iir}$ corresponding to both of the PSCH and SSCH can be determined using the above formulations, which can be represented as follows and calculated in the ChEst and delay module 605:

$$H\_Sqr(m) = (1-\alpha)H\_Sqr(m-1) + \alpha \cdot |\hat{H}_{CPICH}(m)|^2$$

$$CorrH(m) =$$
$$(1-\alpha)CorrH(m-1) + \alpha \cdot Re\{SCH\_CORR^*(m) \cdot \hat{H}_{CPICH}(m)\}$$

$$\hat{\gamma}_{iir}(m) = \frac{CorrH(m)}{H\_Sqr(m)} \cdot \frac{1}{512}$$

Accordingly, $\gamma_{iir}$ can be calculated for both of the PSCH and SSCH using the above formulations based upon the above inputs. Therefore, the reconstructed PSCH and SSCH can be calculated by the multipliers 601, 603 as shown in the below formulations:

$$PSCH\_reconstructed(m) = \hat{\gamma}_{iir,P\text{-}SCH}(m-1) \cdot \hat{H}_{CPICH}(m) \cdot w \cdot s_{P\text{-}SCH}(m)$$

$$SSCH\_reconstructed(m) = \hat{\gamma}_{iir,S\text{-}SCH}(m-1) \cdot \hat{H}_{CPICH}(m) \cdot w \cdot s_{S\text{-}SCH}(m)$$

Where w is a programmable weighting factor that allows for fine-tuning capability of the cancellation of the PSCH and SSCH from the RX data channel. Therefore, referring back to FIG. 5, the output of the SCH reconstruction module 503 is subtracted from the RX input 507 at the adder 511, and the output represents the RX input 507 with the effects of the PSCH and SSCH signal cancelled. Accordingly, the output can be injected back into the RX input processing flow at an appropriate clock rate depending upon the placement of the SCM module 501.

Figure 7:
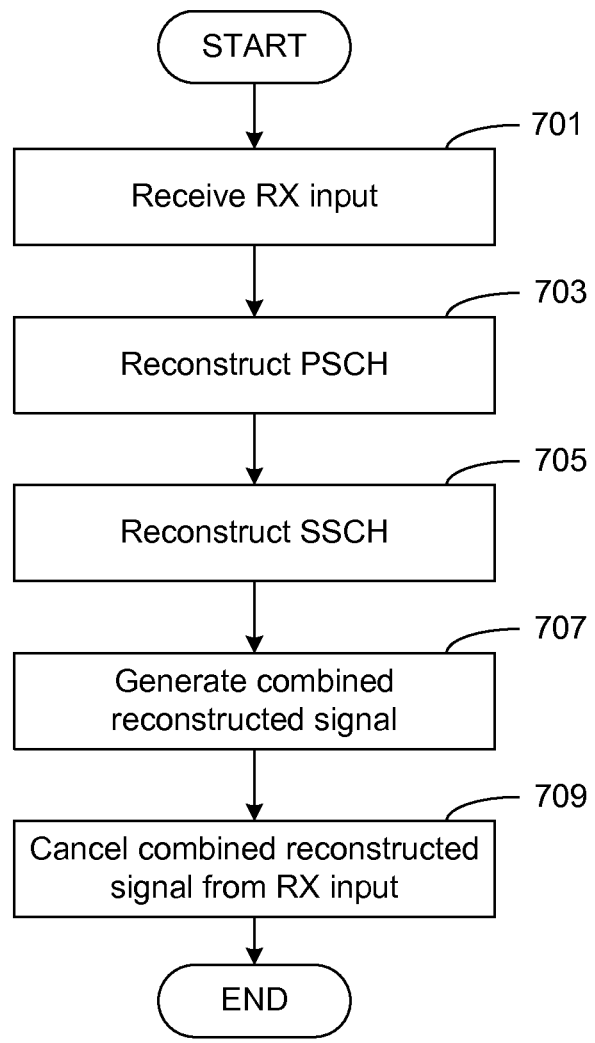
FIG. 7 is a flowchart illustrating execution of the baseband processing module according to various embodiments of the present disclosure.

With reference to FIG. 7, shown is a flowchart that provides one example of the operation of the baseband processing module 222 according to various embodiments. Alternatively, the flowchart of FIG. 7 may be viewed as implementing various steps of a method to cancel the effects of a PSCH and/or SSCH signal in an RX data channel in a baseband processing module 222.

First, in box 701, the baseband processing module 222 can receive an RX input signal. In box 703, the baseband processing module 222 can reconstruct a PSCH signal. In box 705, the baseband processing module 222 can reconstruct a SSCH signal. As noted above, the reconstruction of the PSCH and SSCH is based upon a gain of the PSCH and SSCH relative to the CPICH, a channel estimation of the CPICH, and finger information from the rake receiver, which includes a total power as well as phase information associated with the CPICH. In box 707, the baseband processing module 222 can generate a reconstructed combined signal that includes the reconstructed PSCH and reconstructed SSCH. In box 709, the baseband processing module can cancel the effects of the PSCH and SSCH from the RX input, which can improve performance of a wireless terminal particularly in high geometry situations relative to a base station.

Any logic or functionality illustrated herein, if embodied in software, each block may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processor in a computer system or other system. The machine code may be converted from the source code, etc. If embodied in hardware, each block may represent a circuit or a number of interconnected circuits to implement the specified logical function(s).

Although the flowcharts show a specific order of execution, it is understood that the order of execution may differ from that which is depicted. For example, the order of execution of two or more blocks may be scrambled relative to the order shown. Also, two or more blocks shown in succession may be executed concurrently or with partial concurrence. Further, in some embodiments, one or more of the blocks shown may be skipped or omitted. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

Also, any logic or application described herein that comprises software or code can be embodied in any non-transitory computer-readable medium for use by or in connection with an instruction execution system such as, for example, a processor in a computer system or other system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system. The computer-readable medium can comprise any one of many physical media such as, for example, magnetic, optical, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

It should be emphasized that the above-described embodiments of the present invention are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

Therefore, having thus described the invention, at least the following is claimed:

1. A baseband processing module in a Wideband Code Division Multiple Access (WCDMA) Radio Frequency (RF) transceiver, the baseband processing module comprising:
   an RX interface communicatively coupled to an RF front end of the WCDMA RF transceiver and operable to receive a baseband RX signal from the RF front end carrying a WCDMA signal;
   a synchronization channel interference cancellation module, comprising:
      circuitry configured to reconstruct a primary synchronization channel (PSCH) signal;
      circuitry configured to reconstruct a secondary synchronization channel (SSCH) signal;
      circuitry configured to cancel the PSCH from the baseband RX signal based upon a channel estimation that is derived from power information and phase information received from a rake receiver of the WCDMA RF transceiver;
      circuitry configured to cancel the SSCH from the baseband RX signal based upon the channel estimation that is derived from the power information and the phase information received from the rake receiver of the WCDMA RF transceiver; and
      circuitry configured to impart a delay on the baseband RX signal when reconstruction of at least one of the PSCH signal or the SSCH signal causes a signal delay.

2. The baseband processing module of claim 1, wherein the circuitry that reconstructs the PSCH signal comprises:
   circuitry configured to extract a PSCH sequence from the PSCH signal;
   circuitry configured to determine a relative gain associated with the PSCH signal; and
   circuitry configured to generate a reconstructed PSCH signal from the PSCH sequence, the relative gain associated with the PSCH, and the channel estimation.

3. The baseband processing module of claim 1, wherein the circuitry configured to reconstruct the SSCH signal comprises:
   circuitry configured to extract a SSCH sequence;
   circuitry configured to determine a relative gain associated with the SSCH signal; and
   circuitry configured to generate a reconstructed SSCH signal from the SSCH sequence, the relative gain associated with the SSCH signal, and the channel estimation.

4. The baseband processing module of claim 1, further comprising circuitry configured to generate a combined reconstructed signal based upon the reconstructed PSCH signal and the reconstructed SSCH signal.

5. The baseband processing module of claim 4, further comprising circuitry configured to cancel the combined reconstructed signal from the baseband RX signal.

6. The baseband processing module of claim 5, wherein the circuitry configured to cancel the combined reconstructed signal from the baseband RX signal comprises circuitry configured to subtract the combined reconstructed signal from the baseband RX signal.

7. The baseband processing module of claim 1, wherein the circuitry configured to cancel the PSCH from the baseband RX signal and the circuitry configured to cancel the SSCH from the baseband RX signal are further based upon an antenna diversity associated with the WCDMA RF transceiver.

8. The baseband processing module of claim 1, wherein the channel estimation is based upon at least one of timing information associated with a pilot channel, phase information associated with the pilot channel, or a total power associated with the pilot channel.

9. The baseband processing module of claim 1, wherein the channel estimation is further based upon timing information associated with a pilot channel.

10. A method executed in a baseband processing module in a Wideband Code Division Multiple Access (WCDMA) Radio Frequency (RF) transceiver, the method comprising:
    reconstructing a primary synchronization channel (PSCH) signal;
    reconstructing a secondary synchronization channel (SSCH) signal;
    cancelling the PSCH from a baseband RX signal based upon a channel estimation that is derived from power information and phase information received from a rake receiver of the WCDMA RF transceiver;
    cancelling the SSCH from the baseband RX signal based upon the channel estimation that is derived from the power information and the phase information received from the rake receiver of the WCDMA RF transceiver; and
    imparting a delay on the baseband RX signal when reconstruction of at least one of the PSCH signal or the SSCH signal causes a signal delay,
    wherein the baseband processing module comprises an RX interface communicatively coupled to an RF front end of the WCDMA RF transceiver and operable to receive the baseband RX signal from the RF front end carrying a WCDMA signal.

11. The method of claim 10, wherein reconstructing the PSCH signal further comprises:
    extracting a PSCH sequence from the PSCH signal;
    determining a relative gain associated with the PSCH signal; and
    generating a reconstructed PSCH signal from the PSCH sequence, the relative gain associated with the PSCH, and the channel estimation.

12. The method of claim 10, wherein reconstructing the PSCH signal further comprises:
    extracting a SSCH sequence from the SSCH signal;
    determining a relative gain associated with the SSCH signal; and generating a reconstructed SSCH signal from the SSCH sequence, the relative gain associated with the SSCH signal, and the channel estimation.

13. The method of claim 10, further comprising generating a combined reconstructed signal based upon the reconstructed PSCH signal and the reconstructed SSCH signal.

14. The method of claim 13, further comprising cancelling the combined reconstructed signal from the baseband RX signal.

15. The method of claim 14, wherein cancelling the combined reconstructed signal from the baseband RX signal further comprises subtracting the combined reconstructed signal from the baseband RX signal.

16. The method of claim 10, wherein cancelling the PSCH signal from the baseband RX signal is further based at least in part upon an antenna diversity associated with the WCDMA RF transceiver.

17. The method of claim 10, wherein the channel estimation is further based upon at least one of timing information associated with a pilot channel, phase information associated with the pilot channel, or a total power associated with the pilot channel.

18. (The method of claim 10, wherein the power information and the phase information are for a pilot channel.

19. A Wideband Code Division Multiple Access (WCDMA) Radio Frequency (RF) transceiver comprising:
   a baseband processing module that comprises:
      an RX interface communicatively coupled to an RF front end of the WCDMA RF transceiver and operable to receive a baseband RX signal from the RF front end carrying a WCDMA signal;
      circuitry configured to generate a channel estimation based upon power information and phase information received from a rake receiver of the WCDMA RF transceiver;
      circuitry configured to cancel a primary synchronization channel (PSCH) signal from a baseband RX signal based upon the channel estimation;
      circuitry configured to cancel a secondary synchronization channel (SSCH) signal from the baseband RX signal based upon the channel estimation; and
      circuitry configured to impart a delay on the baseband RX signal when reconstruction of at least one of the PSCH signal or the SSCH signal causes a signal delay.

20. The WCDMA RF transceiver of claim 19, wherein the baseband processing module is on a single integrated circuit.

* * * * *